United States Patent
Fujii et al.

(10) Patent No.: US 11,145,569 B2
(45) Date of Patent: Oct. 12, 2021

(54) MODULE EQUIPPED WITH A HEAT DISSIPATION MEMBER

(71) Applicant: Murata Manufacturing Co., Ltd., Kyoto (JP)

(72) Inventors: Akihiro Fujii, Kyoto (JP); Toru Komatsu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 70 days.

(21) Appl. No.: 16/550,454

(22) Filed: Aug. 26, 2019

(65) Prior Publication Data
US 2019/0378779 A1 Dec. 12, 2019

Related U.S. Application Data

(63) Continuation of application No. PCT/JP2018/006468, filed on Feb. 22, 2018.

(30) Foreign Application Priority Data

Feb. 28, 2017 (JP) .............................. JP2017-037118

(51) Int. Cl.
*H01L 23/42* (2006.01)
*H01L 23/498* (2006.01)
(Continued)

(52) U.S. Cl.
CPC ............ *H01L 23/42* (2013.01); *H01L 23/498* (2013.01); *H01L 23/538* (2013.01);
(Continued)

(58) Field of Classification Search
CPC ........... H01L 2924/3025; H01L 23/367; H01L 23/4334; H01L 23/49805;
(Continued)

(56) References Cited

U.S. PATENT DOCUMENTS

2003/0179549 A1 9/2003 Zhong et al.
2008/0258294 A1 10/2008 Tseng et al.
(Continued)

FOREIGN PATENT DOCUMENTS

CN 101221944 A 7/2008
JP H04-368155 A 12/1992
(Continued)

OTHER PUBLICATIONS

International Search Report for International Application No. PCT/JP2018/006468, dated Apr. 10, 2018.
(Continued)

*Primary Examiner* — Jasmine J Clark
(74) *Attorney, Agent, or Firm* — Pearne & Gordon LLP

(57) ABSTRACT

A module that has excellent heat dissipation performance and enables height reduction easily is provided. The module includes a wiring substrate, a plurality of components mounted on the top surface of the wiring substrate, a plurality of heat dissipation members, a sealing resin layer laminated on the top surface of the wiring substrate, and a shield film that covers surfaces of the sealing resin layer. The heat dissipation member is formed into a strip-shaped sheet. In addition, both end portions of the heat dissipation member are in contact with the top surface of the wiring substrate and also with the components disposed between the both end portions. The heat dissipation member thereby forms a heat dissipation path that transmits heat generated by the component to the wiring substrate.

11 Claims, 3 Drawing Sheets

(51) Int. Cl.
*H01L 23/538* (2006.01)
*H01L 23/552* (2006.01)
*H01L 25/16* (2006.01)
*H01L 23/00* (2006.01)

(52) U.S. Cl.
CPC ............ *H01L 23/552* (2013.01); *H01L 25/16* (2013.01); *H01L 24/16* (2013.01); *H01L 2224/16227* (2013.01); *H01L 2924/19041* (2013.01); *H01L 2924/19105* (2013.01); *H01L 2924/3025* (2013.01)

(58) Field of Classification Search
CPC . H01L 2924/19042; H01L 2924/19106; H01L 2924/19043; H01L 2924/19105; H01L 2224/16227; H01L 23/42; H01L 23/498; H01L 23/538; H01L 25/16; H01L 23/552; H01L 24/16; H01L 2924/19041; H01L 23/28; H01L 23/00; H01L 2924/19101
See application file for complete search history.

(56) References Cited

U.S. PATENT DOCUMENTS

| 2009/0091904 | A1 | 4/2009 | Hatanaka et al. |
| 2015/0340350 | A1* | 11/2015 | Koga ................. H01L 24/73 257/713 |
| 2018/0108618 | A1* | 4/2018 | Yamamoto ............ C23C 14/24 |

FOREIGN PATENT DOCUMENTS

| JP | 2008-34778 A | 2/2008 |
| JP | 2011-211023 A | 10/2011 |
| JP | 5894612 B2 | 3/2016 |

OTHER PUBLICATIONS

Written Opinion for International Application No. PCT/JP2018/006468, dated Apr. 10, 2018.

* cited by examiner

MODULE EQUIPPED WITH A HEAT DISSIPATION MEMBER

This is a continuation of International Application No. PCT/JP2018/006468 filed on Feb. 22, 2018 which claims priority from Japanese Patent Application No. 2017-037118 filed on Feb. 28, 2017. The contents of these applications are incorporated herein by reference in their entireties.

BACKGROUND

Technical Field

The present disclosure relates to a module equipped with a heat dissipation member.

Various modules are mounted on a mother board of an electronic device, such as a communication terminal device. For example, as illustrated in FIG. 6, a module 100 described in Patent Document 1 includes a wiring substrate 101 on which multiple components 102a and 102b are mounted, a sealing resin layer 103 that covers the components 102a and 102b, and a shield metal film 104 that covers surfaces of the sealing resin layer 103. Of the components 102a and 102b, the component 102a (semiconductor element) is mounted on the wiring substrate 101 by flip chip bonding.

Patent Document 1: Japanese Unexamined Patent Application Publication No. 2011-211023 (see paragraphs 0023 to 0030, FIG. 1, and so on)

BRIEF SUMMARY

In the above-described module, when a heat generating component, such as a semiconductor element, is included among multiple components mounted on the module and the module is energized, the entire module may be heated to a high temperature, which may lead to degradation of performance of the components mounted. Heat needs to be dissipated. However, in the module 100 described in Patent Document 1, major heat dissipation paths that transmit heat generated by a semiconductor element (component 102a) to the wiring substrate 101 are limited to solder bumps, in other words, a connecting portion between the component 102a and the wiring substrate 101. In this case, heat dissipation performance may not be sufficient. As an approach to improve the heat dissipation performance, for example, a heat dissipation member, such as a heat sink, may be disposed on the top surface of the semiconductor element. However, this poses a problem that the thickness of the module increases. As an approach to prevent the thickness of the module from increasing, a thermally conductive sheet may be disposed on the heat generating component such as the semiconductor element. In this case, however, the resin of the sealing resin layer may not be filled into a region around the component, which may degrade the reliability of component connection especially for a component mounted by flip chip bonding.

The present disclosure provides a module that has excellent heat dissipation performance and enables height reduction easily.

The present disclosure provides a module that includes a wiring substrate, a first component mounted on a major surface of the wiring substrate, a sheet-like heat dissipation member that is disposed so as to have a contact portion in contact with the first component and a non-contact portion not in contact with the first component, and a sealing resin layer configured to cover the first component and the major surface of the wiring substrate. In the module, the heat dissipation member has a structure that allows resin of the sealing resin layer to enter a region between the non-contact portion and the first component, and the heat dissipation member forms at least part of a heat dissipation path through which heat generated by the first component is transmitted to the wiring substrate.

According to this configuration, the heat dissipation member having the contact portion in contact with the first component forms at least part of the heat dissipation path that transmits heat generated by the first component to the wiring substrate. This improves heat dissipation performance compared with a module having a heat dissipation path to the wiring substrate only through a contact portion between the first component and the wiring substrate. Moreover, the heat dissipation member is shaped like a sheet, which can reduce the height of the module compared with a configuration in which a heat dissipation member such as a heat sink is disposed on top of a component. In addition, the heat dissipation member has a structure that allows the resin of the sealing resin layer to enter a region between the non-contact portion and the first component. Thus, the resin is filled into a region around the first component. This can increase the strength of solder bumps of the first component and improve the reliability of the module.

The sheet-like heat dissipation member has a sheet shape and the sheet shape may be formed into a strip having a width narrower than a width of the first component.

According to this configuration, the resin of the sealing resin layer can be filled into a gap between the heat dissipation member and the first component, which secures the reliability of the first component.

In addition, the module may include a second component mounted on the major surface of the wiring substrate. In the module, the second component may be a component that generates less heat than the first component, and the non-contact portion of the heat dissipation member may have a portion in contact with the second component.

According to this configuration, the first component is connected to the second component by the heat dissipation member. Heat generated by the first component can be thereby transmitted to the second component that generates less heat. The heat transmitted to the second component can be dissipated from the wiring substrate, which improves heat dissipation performance of the module.

The non-contact portion of the heat dissipation member may have a portion in contact with the major surface of the wiring substrate.

According to this configuration, the heat dissipation member can form a heat dissipation path that transmits heat generated by the first component to the wiring substrate, which also improves the heat dissipation performance of the module.

The module may further include a shield layer configured to cover a surface of the sealing resin layer. In the module, the non-contact portion of the heat dissipation member may have a portion in contact with the shield layer.

According to this configuration, heat generated by the first component can be dissipated also from the shield layer, which further improves heat dissipation performance of the module.

According to the present disclosure, the heat dissipation member having the contact portion in contact with the first component forms at least part of a heat dissipation path that transmits heat generated by the first component to the wiring substrate. This improves heat dissipation performance compared with a module having a heat dissipation path to the wiring substrate only through the contact portion between the first component and the wiring substrate. Moreover, the heat dissipation member is shaped like a sheet that allows the resin of the sealing resin layer to be disposed around components. This can reduce the height of the module and improve the reliability of connection compared with a configuration in which a heat dissipation member such as a heat sink is disposed on the top surface of a component.

DETAILED DESCRIPTION

First Embodiment

Figure 1:
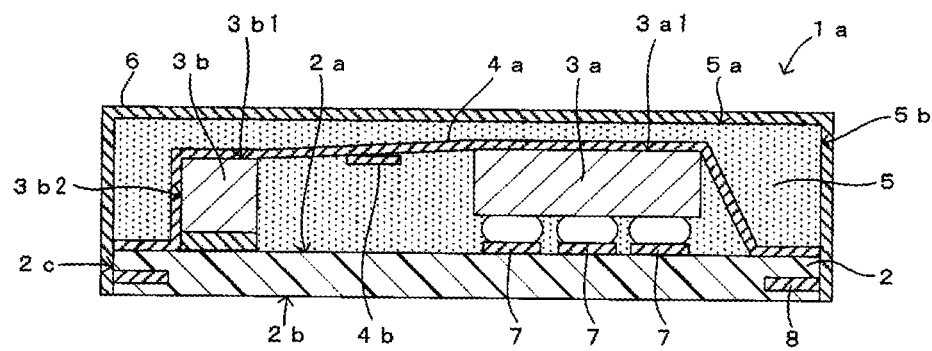
FIG. 1 is a cross-sectional view illustrating a module according to a first embodiment of the present disclosure.
Figure 2:
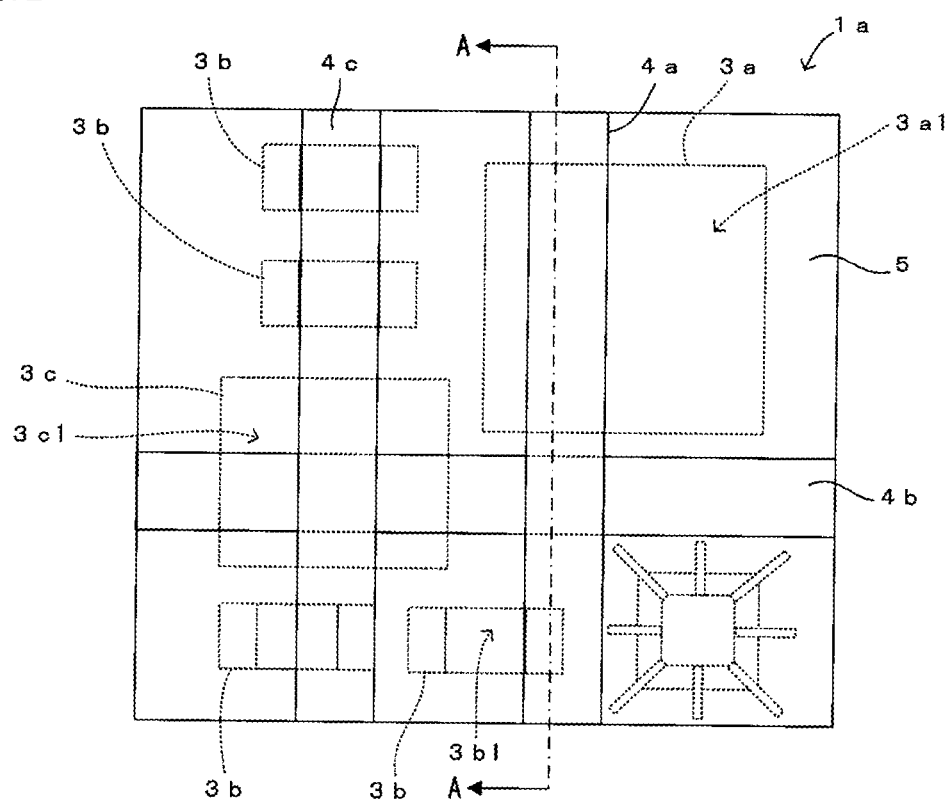
FIG. 2 is a plan view illustrating the module of FIG. 1 from which a shield film is removed.

A module 1a according to a first embodiment of the present disclosure will be described with reference to FIGS. 1 and 2. Note that FIG. 1 is a cross section that is cut along line A-A and viewed in the arrow direction in FIG. 2. FIG. 2 is a plan view (viewed in a direction perpendicular to a top surface 2a of a wiring substrate 2) illustrating the module 1a from which a shield film 6 is removed.

As illustrated in FIGS. 1 and 2, the module 1a according to the present embodiment includes the wiring substrate 2, a plurality of components 3a to 3c mounted on the top surface 2a of the wiring substrate 2, a plurality of heat dissipation members 4a to 4c, a sealing resin layer 5 laminated on the top surface 2a of the wiring substrate 2, and a shield film 6 that covers surfaces of the sealing resin layer 5. The module 1a is mounted, for example, on a mother substrate of an electronic device in which high-frequency signals are used.

The wiring substrate 2 is formed, for example, by laminating a plurality of insulating layers made of a material, such as a low temperature co-fired ceramic material or a glass-epoxy resin. In addition, the major surfaces of the wiring substrate 2 (top surface 2a and bottom surface 2b) are shaped like rectangles. Mounting electrodes 7 for mounting the components 3a to 3c are formed on the top surface 2a of the wiring substrate 2 (the top surface 2a corresponds to "one major surface of a wiring substrate" according to the present disclosure). A plurality of outer electrodes (not illustrated) for external connection are formed at the bottom surface 2b of the wiring substrate 2. Various internal wiring electrodes 8 are formed between adjacent insulating layers. The mounting electrodes 7, the internal wiring electrodes 8, and the outer electrodes are made of copper (Cu), silver (Ag), aluminum (Al) or the like, which is a metal generally adopted to form circuit electrodes.

The components 3a to 3c are formed of semiconductor elements made of a semiconductor, such as silicon (Si) and gallium arsenide (GaAs), or formed of chip components, such as a chip inductor, a chip capacitor, a chip resistor, or the like. The components 3a to 3c are mounted on the wiring substrate 2 by using a general surface mount technology, such as soldering. Note that in the present embodiment, the component 3b (which corresponds to a "second component" according to the present disclosure) is formed of a passive component, such as the chip capacitor, whereas the components 3a and 3c (which correspond to "first components" according to the present disclosure) are formed of active components, such as an integrated circuit (IC), a power amplifier (PA), or a low-noise amplifier (LNA), that generate more heat than the component 3b when energized.

Each of the heat dissipation members 4a to 4c has a sheet shape and the sheet shape is formed into a strip-shaped sheet. In addition, as illustrated in FIG. 2, each of the heat dissipation members 4a to 4c is disposed such that as viewed perpendicularly to the top surface 2a of the wiring substrate 2 (or otherwise expressed as "as viewed in plan view"), one end portion of each of the heat dissipation members 4a to 4c is in contact with one side of the top surface 2a of the wiring substrate 2 and the other end portion is in contact with a side that is opposite to the one side. In other words, as viewed in plan view, each of the heat dissipation members 4a to 4c is disposed so as to bridge over the wiring substrate 2 and to connect opposite sides of the top surface 2a with each other.

In addition, each of the heat dissipation members 4a to 4c has a portion to be in contact with designated components such as the components 3a to 3c and also has a portion to be in contact with the top surface 2a of the wiring substrate 2. For example, as illustrated in FIG. 1, one end portion of the heat dissipation member 4a is in contact with an edge portion of the top surface 2a of the wiring substrate 2 (i.e., a portion near one side of the top surface 2a), and the other end portion is also in contact with another edge portion of the top surface 2a of the wiring substrate 2 (i.e., a portion near a side opposite to the one side). In addition, in the case in which the components 3a and 3b are disposed between both end portions of the heat dissipation member 4a, the heat dissipation member 4a is in contact with a top surface 3a1 of the component 3a and also with a top surface 3b1 and a side surface 3b2 of the component 3b. Accordingly, as illustrated in the cross section of FIG. 1, the heat dissipation member 4a is bent and disposed in such a manner that the top surface 2a of the wiring substrate 2 and the heat dissipation member 4a surround the components 3a and 3b.

Thus, the heat dissipation member 4a connects the top surface 3a1 of the component 3a, which is the heat generating component, with the top surface 2a of the wiring substrate 2. Accordingly, the heat dissipation member 4a forms a heat dissipation path that transmits heat generated by the component 3a to the wiring substrate 2. In addition, the heat dissipation member 4a is also in contact with the component 3b that generates a smaller amount of heat than the component 3a. The heat dissipation member 4a transmits heat from the component 3a also to the component 3b, which makes part of the heat dissipation path.

Similarly, the other heat dissipation members 4b and 4c are each disposed so as to bridge over the wiring substrate 2 and to connect opposite sides of the top surface 2a. In addition, the heat dissipation members 4b and 4c are disposed so as to be in contact with the top surface 2a of the wiring substrate 2 and also with the top surfaces 3a1 to 3c1 of corresponding components 3a to 3c that are disposed between both end portions of respective heat dissipation members 4b and 4c. In the present embodiment, as illustrated in FIG. 2, the heat dissipation members 4a and 4c are disposed so as to be parallel to the short sides of the top surface 2a of the wiring substrate 2, whereas the heat dissipation member 4b is disposed so as to be parallel to the long sides of the top surface 2a of the wiring substrate 2. Accordingly, the heat dissipation members 4a and 4c are disposed so as to orthogonally intersect with the heat dissipation member 4b.

The heat dissipation members 4a to 4c may be formed of a sheet, such as a thermally conductive resin sheet having flexibility or a metal laminate sheet that is formed by adhering a piece of a metal foil (for example, a Cu foil) or a metal film to a sheet made of a flexible organic material. Because of the flexibility, the heat dissipation members 4a to 4c can be handled easily during installation. Note that the sheet that constitutes the heat dissipation members 4a to 4c may have adhesiveness. This facilitates adhesion of the heat dissipation members 4a to 4c along the shapes of components. This can also prevent a problem that the heat dissipation members 4a to 4c move when the sealing resin layer 5 is formed.

The sealing resin layer 5 is laminated on the top surface 2a of the wiring substrate 2 so as to cover the components 3a to 3c and the heat dissipation members 4a to 4c. As illustrated in FIG. 1, the sealing resin layer 5 buries the heat dissipation members 4a to 4c while the resin of the sealing resin layer 5 is present between the top surface 2a of the wiring substrate 2 and the portions of heat dissipation members 4a to 4c that are not in contact with the components 3a to 3c. In other words, the resin of the sealing resin layer 5 is filled into regions around the components 3a to 3c. Note that the sealing resin layer 5 can be formed of a resin such as epoxy resin, which is generally adopted as a sealing resin.

The shield film 6 (which corresponds to a "shield layer" of the present disclosure) covers surfaces (top surface 5a and side surfaces 5b) of the sealing resin layer 5 and side surfaces 2c of the wiring substrate 2. Both end portions of respective heat dissipation members 4a to 4c are exposed from the side surfaces 5b of the sealing resin layer 5 and are connected with the shield film 6. An end portion of a ground electrode among the internal wiring electrodes 8 of the wiring substrate 2 is also exposed from a side surface 2c of the wiring substrate 2 and is connected with the shield film 6.

The shield film 6 may be formed as a multilayer structure having an adhesive film laminated on the top surface 5a of the sealing resin layer 5, an electroconductive film laminated on the adhesive film, and a protection film laminated on the electroconductive film. The adhesive film is disposed for the purpose of increasing the adhesion strength between the electroconductive film and the sealing resin layer 5. For example, the adhesive film may be made of a metal, such as a stainless steel (SUS). The electroconductive film is a shielding layer to provide the shield film 6 with a substantial shielding function and may be made, for example, of one of copper (Cu), silver (Ag), and aluminum (Al). The protection film, which is provided for preventing the electroconductive film from corroding or receiving scratches, is made of, for example, a stainless steel (SUS).

According to the embodiment described above, the heat dissipation members 4a to 4c having contact portions in contact with the components 3a and 3c, which are heat generating components, form the heat dissipation path that transmits heat generated by the components 3a and 3c to the wiring substrate 2. This improves heat dissipation performance compared with a module having a heat dissipation path to the wiring substrate only through contact portions between the heat generating components and the wiring substrate. Moreover, the heat dissipation members 4a to 4c are shaped like sheets, which can reduce the height of the module 1a compared with a configuration in which a heat dissipation member such as a heat sink is disposed on top of a component.

Moreover, the heat dissipation members 4a to 4c connects the components 3a and 3c with the component 3b that generates less heat, which can transmit heat generated by the components 3a and 3c (heat generating components) to the components 3b that generates less heat. Accordingly, when the heat generating components 3a to 3c generate heat, the increased temperature due to heat generation can be equalized over the components 3a to 3c as a whole, thereby suppressing deterioration in performance.

Moreover, the end portions of the heat dissipation members 4a to 4c are in contact with the top surface 2a of the wiring substrate 2. Accordingly, the heat dissipation members 4a to 4c can transmit heat generated by the components 3a and 3c (heat generating components) directly to the wiring substrate 2 without necessarily passing through other members.

In addition, the end portions of the heat dissipation members 4a to 4c are connected with the shield film 6. Heat generated by the components 3a and 3c (heat generating components) can be dissipated from the shield film 6, which can further improve the heat dissipation performance of the module 1a.

Another approach to dissipate heat generated by the heat generating components from the wiring substrate may be to cover and seal the entire region in which components are mounted with a thermally conductive sheet. In this case, the thermally conductive sheet covers the component-mounted region after the components are mounted on the wiring substrate, and subsequently the region is sealed by a resin. However, the resin of the sealing resin layer is not filled into gaps between the thermally conductive sheet and the components, which may degrade the reliability of component connection. In this case, however, according to the present embodiment, the heat dissipation members 4a to 4c do not entirely cover the components 3a to 3c but are formed as narrow strips having a width smaller than each width of the components 3a to 3c as viewed in plan view. This enables the resin of the sealing resin layer 5 to be filled into the gaps between the heat dissipation members 4a to 4c and the components 3a to 3c and thereby secures the reliability of connection of the components 3a to 3c.

Modification Example of Heat Dissipation Member

Figure 3:
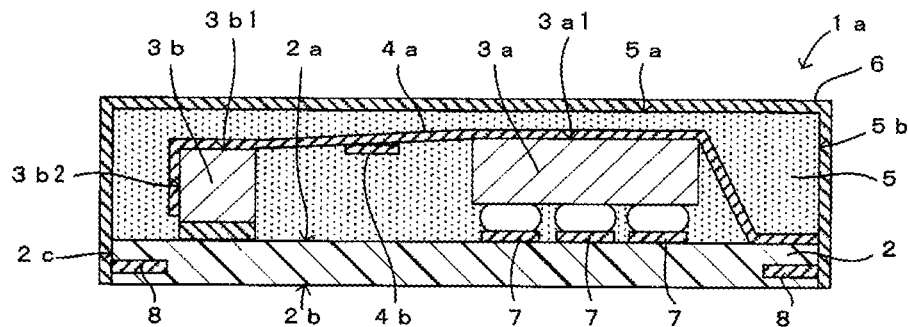
FIG. 3 is a view illustrating a modification example of a heat dissipation member illustrated in FIG. 1.

Both end portions of the heat dissipation members 4a to 4c according to the present embodiment may not necessarily be in contact with the top surface 2a of the wiring substrate 2. For example, as illustrated in FIG. 3, one end portion of each of the heat dissipation members 4a to 4c is in contact with the top surface 2a of the wiring substrate 2. However, the other end portion may not be in contact with the top surface 2a of the wiring substrate 2 but may be in contact with the component 3b that is different from the components 3a and 3c (heat generating components). In this case, the heat dissipation members 4a to 4c transmit heat generated by the components 3a and 3c (heat generating components) to the component 3b and further to the wiring substrate 2 from the component 3b. In other words, in this case, the heat dissipation members 4a to 4c form part of the heat dissipation path that transmits heat generated by the components 3a and 3c (heat generating components) to the wiring substrate 2.

Second Embodiment

A module 1b according to the second embodiment of the present disclosure will be described with reference to FIG.

4. Note that FIG. 4 is a cross section of the module 1*b*, and this cross section corresponds to that of FIG. 1.

Figure 4:
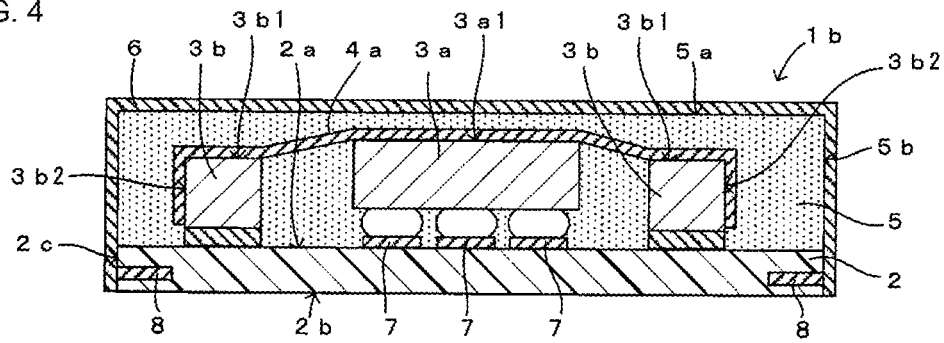
FIG. 4 is a cross-sectional view illustrating a module according to a second embodiment of the present disclosure.

The module 1*b* according to the present embodiment is different from the module 1*a* of the first embodiment described with reference to FIG. 1 in that as illustrated in FIG. 4, the components 3*a* to 3*c* are arranged differently and the heat dissipation members 4*a* to 4*c* are configured differently. Other configurations are the same as those of the module 1*a* of the first embodiment. Accordingly, the same elements are denoted by the same references, and duplicated description is omitted.

In the case of the module 1*b*, the components 3*b* that generate less heat are disposed on both side regions with respect to the component 3*a* (heat generating component), and the heat dissipation member 4*a* is in contact with the top surface 3*a*1 of the component 3*a* and also with the top surfaces 3*b*1 and the side surfaces 3*b*2 of the components 3*b* located next to the component 3*a*.

The advantageous effects similar to those of the first embodiment can be also obtained with this configuration. Note that in the present embodiment, the heat dissipation member 4*a* transmits heat generated by the component 3*a* (heat generating component) to adjacent components 3*b* and further to the wiring substrate 2 from the components 3*b*. In other words, in this case, the heat dissipation member 4*a* forms part of the heat dissipation path that transmits heat generated by the component 3*a* (heat generating component) to the wiring substrate 2.

Third Embodiment

A module 1*c* according to the third embodiment of the present disclosure will be described with reference to FIG. 5. Note that FIG. 5 is a cross section of the module 1*c*, and this cross section corresponds to that of FIG. 1.

Figure 5:
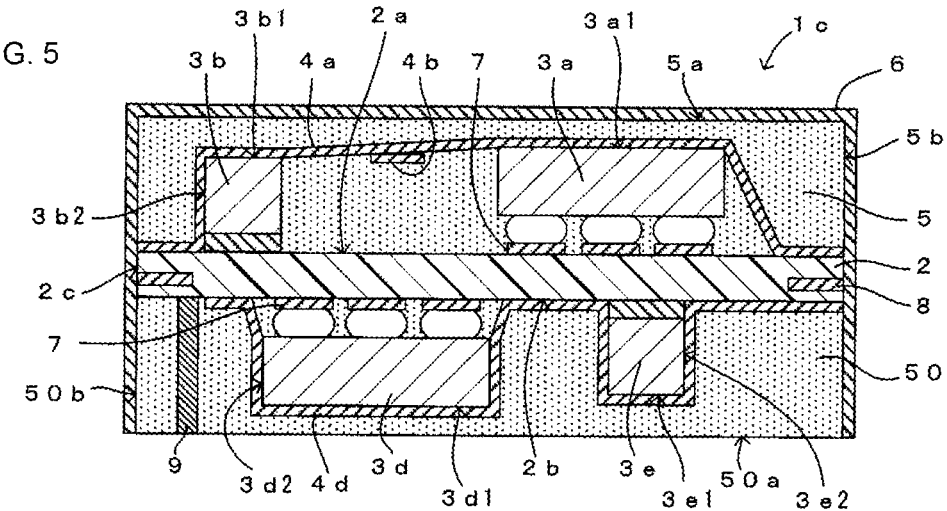
FIG. 5 is a cross-sectional view illustrating a module according to a third embodiment of the present disclosure.
Figure 6:
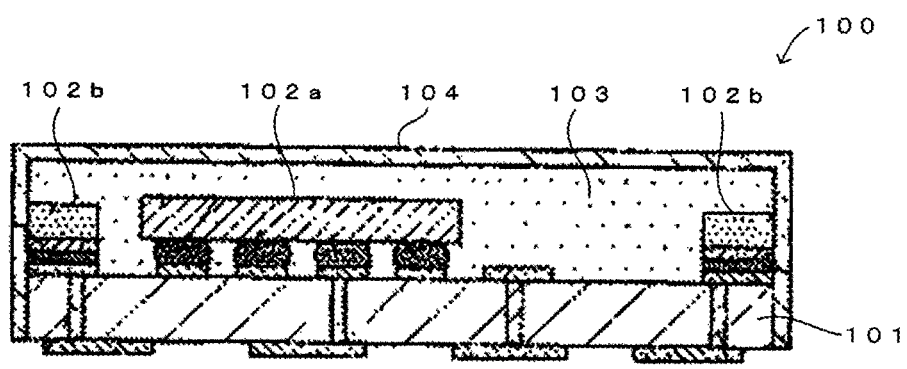
FIG. 6 is a cross-sectional view illustrating a known module.

The module 1*c* according to the present embodiment is different from the module 1*a* of the first embodiment described with reference to FIGS. 1 and 2 in that as illustrated in FIG. 5, components 3*d* and 3*e* are also disposed on the bottom surface 2*b* of the wiring substrate 2, a heat dissipation member 4*d* is disposed for the components 3*d* and 3*e*, and a pillar-shaped external connection terminal 9 is erected on the bottom surface 2*b* of the wiring substrate 2. Other configurations are the same as those of the module 1*a* of the first embodiment. Accordingly, the same elements are denoted by the same references, and duplicated description is omitted.

In the case of the module 1*c*, the component 3*d* is a heat generating component (semiconductor element) and the component 3*e* is a component that generates less heat. Similarly to the heat dissipation members 4*a* to 4*c* of the first embodiment, the heat dissipation member 4*d* is formed into a strip-shaped sheet and is in contact with the bottom surface 2*b* of the wiring substrate 2. In addition, the heat dissipation member 4*d* is in contact with the bottom surface 3*d*1 and a side surface 3*d*2 of the component 3*d* and also with the bottom surface 3*e*1 and a side surface 3*e*2 of the component 3*e*. The components 3*d* and 3*e*, the heat dissipation member 4*d*, and the external connection terminal 9 are sealed with a sealing resin layer 50. Here, one end of the external connection terminal 9 is connected to the bottom surface 2*b* of the wiring substrate 2, whereas the other end is exposed from the bottom surface 50*a* of the sealing resin layer 50. The shield film 6 covers the top surface 5*a* and the side surfaces 5*b* of the sealing resin layer 5 installed on the top surface 2*a* of the wiring substrate 2 and also covers the side surfaces 2*c* of the wiring substrate 2. The shield film 6 also covers side surfaces 50*b* of the sealing resin layer 50 installed on the bottom surface 2*b* of the wiring substrate 2.

According to this configuration, heat generated by the component 3*d* (heat generating component) mounted on the bottom surface 2*b* of the wiring substrate 2 can be transmitted to the wiring substrate 2 by the heat dissipation member 4*d*.

Note that the present disclosure is not limited to the embodiments described above but is subjected to various modifications and alterations other than those described above insofar as not departing from the scope of the disclosure. For example, the configurations of the above embodiments may be combined with each other.

In the above embodiments, the heat dissipation members 4*a* to 4*d* have been formed into the strip-shaped sheets. However, the shapes of the heat dissipation members 4*a* to 4*d* may be changed appropriately insofar as the heat dissipation members 4*a* to 4*d* do not seal the component 3*a* to 3*d* that are to be covered with the resin. For example, the heat dissipation members 4*a* to 4*d* may be shaped so as to entirely cover a target component but have multiple holes that allow the resin of the sealing resin layers 5 and 50 to flow through.

Moreover, the heat dissipation members 4*a* to 4*d* have been disposed so as to be parallel to corresponding sides of the major surfaces (top surface 2*a* and bottom surface 2*b*) of the wiring substrate 2. However, the heat dissipation members 4*a* to 4*d* may be disposed so as not to be parallel to the sides. Furthermore, both ends of the heat dissipation members 4*a* to 4*d* have been exposed from the side surfaces 5*b* and 50*b* of the sealing resin layers 5 and 50. However, both ends of the heat dissipation members 4*a* to 4*d* need not be exposed therefrom.

In addition, in the third embodiment, the shield film 6 has been configured to cover the top surface 5*a* and the side surfaces 5*b* of the sealing resin layer 5 and the side surfaces 2*c* of the wiring substrate 2 as well as to cover the side surfaces 50*b* of the sealing resin layer 50. However, the shield film 6 may also cover the bottom surface 50*a* of the sealing resin layer 50. In this case, the shield film 6 is configured not to cover a portion of the bottom surface 50*a* of the sealing resin layer 50 where the other end of the external connection terminal 9 is exposed.

INDUSTRIAL APPLICABILITY

The present disclosure is applicable to various modules that include a heat dissipation member that dissipates heat generated by a component mounted on a wiring substrate.

REFERENCE SIGNS LIST

1*a* to 1*c* module
2 wiring substrate
3*a*, 3*c*, 3*d* component (first component)
3*b*, 3*e* component (second component)
4*a* to 4*d* heat dissipation member
5, 50 sealing resin layer
6 shield film (shield layer)

The invention claimed is:

1. A module comprising:
a wiring substrate;
a first component mounted on a major surface of the wiring substrate;
a sheet-like heat dissipation member that is disposed so as to have a contact portion in direct contact with the first component and a non-contact portion not in contact with the first component; and a sealing resin layer configured to cover the first component and the major surface of the wiring substrate, wherein a region between the non-contact portion of the heat dissipation member and the first component comprises resin of the sealing resin layer, and the heat dissipation member constitutes at least part of a heat dissipation path through which heat generated by the first component is transmitted to the wiring substrate.

2. The module according to claim 1, wherein the sheet-like heat dissipation member comprises a strip having a width narrower than a width of the first component.

3. The module according to claim 1, further comprising: a second component mounted on the major surface of the wiring substrate, wherein the second component is a component that generates less heat than the first component, and the non-contact portion of the heat dissipation member has a portion in contact with the second component.

4. The module according to claim 1, wherein the non-contact portion of the heat dissipation member has a portion in contact with the major surface of the wiring substrate.

5. The module according to claim 1, further comprising: a shield layer configured to cover a surface of the sealing resin layer, wherein the non-contact portion of the heat dissipation member has a portion in contact with the shield layer.

6. The module according to claim 2, further comprising: a second component mounted on the major surface of the wiring substrate, wherein the second component is a component that generates less heat than the first component, and the non-contact portion of the heat dissipation member has a portion in contact with the second component.

7. The module according to claim 2, wherein the non-contact portion of the heat dissipation member has a portion in contact with the major surface of the wiring substrate.

8. The module according to of claim 3, wherein the non-contact portion of the heat dissipation member has a portion in contact with the major surface of the wiring substrate.

9. The module according to claim 2, further comprising: a shield layer configured to cover a surface of the sealing resin layer, wherein the non-contact portion of the heat dissipation member has a portion in contact with the shield layer.

10. The module according to claim 3, further comprising: a shield layer configured to cover a surface of the sealing resin layer, wherein the non-contact portion of the heat dissipation member has a portion in contact with the shield layer.

11. The module according to claim 4, further comprising: a shield layer configured to cover a surface of the sealing resin layer, wherein the non-contact portion of the heat dissipation member has a portion in contact with the shield layer.

* * * * *